United States Patent

Shokoohi et al.

[11] Patent Number: 5,110,696
[45] Date of Patent: May 5, 1992

[54] RECHARGEABLE LITHIATED THIN FILM INTERCALATION ELECTRODE BATTERY

[75] Inventors: Frough K. Shokoohi, Bedminster; Jean-Marie Tarascon, Martinsville, both of N.J.

[73] Assignee: Bell Communications Research, Livingston, N.J.

[21] Appl. No.: 733,224

[22] Filed: Jul. 22, 1991

Related U.S. Application Data

[63] Continuation-in-part of Ser. No. 612,086, Nov. 9, 1990, abandoned.

[51] Int. Cl.$^5$ .................. H01M 4/48; C01D 15/00
[52] U.S. Cl. .................. 429/218; 29/623.5; 427/372.2; 423/594; 423/641; 423/599; 429/224
[58] Field of Search ............... 429/194, 218, 224, 223; 29/623.5, 623.1; 427/255.3, 248.1, 331, 372.2, 419.2; 252/182.1

[56] References Cited

U.S. PATENT DOCUMENTS

| 4,340,652 | 7/1982 | Raistrick et al. | 429/112 |
| 4,567,031 | 7/1986 | Riley | 423/593 |
| 4,828,834 | 5/1989 | Nagaura et al. | 429/194 |

Primary Examiner—Anthony Skapars
Attorney, Agent, or Firm—Leonard Charles Suchyta; Lionel N. White

[57] ABSTRACT

A Thin film electrode for a rechargeable (secondary) battery is prepared by electron beam deposition of $LiMn_2O_4$, $LiCoO_2$, or $LiNiO_2$ on a smooth, amorphous substrate surface and in situ annealing of the deposited lithium composition at a temperature below about 500° C. The amorphous nature of the substrate surface prevents epitaxial growth or ordered orientation of the minute composition crystallites thus formed. The finely granular structure of the resulting electrode thin film presents abundant surface area that enables a 4V battery to provide current densities in the range of 500 microamps/cm$^2$. The low annealing temperature enables formation of the electrode structure and subsequent battery assembly directly upon semiconductor devices and integrated circuitry.

17 Claims, 3 Drawing Sheets

RECHARGEABLE LITHIATED THIN FILM INTERCALATION ELECTRODE BATTERY

RELATED APPLICATION

This application is a Continuation-in-Part of Ser. No. 07/612,086, filed Nov. 9, 1990, now abandoned.

BACKGROUND OF THE INVENTION

This invention relates to secondary (rechargeable) lithium batteries which utilize thin film intercalation compounds, principally as the positive electrode. In particular, the invention provides means for fabricating such battery electrodes as thin films of lithiated ternary transition metal oxides, including $LiMn_2O_4$, $LiCoO_2$, and $LiNiO_2$.

Rapid growth in the use of electronics instrumentation ranging from sophisticated telecommunication equipment and computers to audio-visual systems, watches, and toys has generated a wide-spread requirement for electronic circuits that include devices having their own power sources and energy storage. Therefore, there is a critical need for low-cost, miniaturized, rechargeable energy storage devices (batteries) that have high energy densities and can deliver power reliably at a constant voltage over many recharge cycles. As an additional requirement for most practical applications, the fabrication of these secondary batteries must be compatible with microelectronics technologies in order that such power sources may be fully integrated into complex microcircuits.

Thin-film, multilayer heterostructure systems including compounds capable of intercalating lithium ions have thus far offered the most promise of meeting the need for miniaturized secondary batteries. For example, Meunier et al., in *Mat. Sci. and Eng.*, B3 (1989) 19–23, describe such layered structures that include $TiS_2$ or $TiS_xO_y$ positive electrode intercalation compounds with elemental lithium negative electrodes. These materials provide only about 1.25 to 2.6 V at a 1 microamp/$cm^2$ current density, however. A similar lithium anode thin film cell described in U.S. Pat. No. 4,751,159 employs $AgMo_6S_8$ as the positive electrode intercalation material and is reportedly capable of providing voltages of about 1.4 to 3 V at a current density of 300 microamps/$cm^2$. Although this intercalation cathode compound shows improving performance capability, thin film battery composites continue to suffer from the disadvantage of depending upon dangerously reactive lithium metal anodes as the $Li^+$ ion source.

Further improved performance with open circuit voltages in the range of 4 V at energy densities of 200 to 500 microamps/$cm^2$ has been exhibited by secondary battery cells having bulk, pelletized positive intercalation electrodes of three-dimensional, spinel-structured $LiMn_2O_4$ (U.S. Pat. No. 4,828,834), and layered $LiCoO_2$ (Mizushima et al., *Mat. Res. Bull.*, 15, 783 (1980)) and $LiNiO_2$ (Dahn et al., *Solid State Ionics*, 44, 87 (1990)). These materials exhibit the additional benefits of being light weight and providing a source of lithium ions that enables substitution of similar or other intercalatable materials, e.g., graphite, $WO_2$, and Al, for the environmentally undesirable lithium metal anode.

Unfortunately, however, these lithiated transition metal oxides have properties that until now have detracted from their serious consideration as candidates in thin film fabrication processes with widely-used electronic component materials such as GaAs and silicon. Initially, the great disparity between the melting points and atomic masses of lithium and the transition metal constituent would ordinarily prevent stoichiometric deposition from a bulk intercalation compound source in commonly-employed fabrication processes such as reactive electron beam evaporation. Further, the high temperatures, often in excess of 800° C., at which these intercalation compounds are normally crystallized in bulk are inimical to their incorporation into microcircuits with GaAs decomposing above 350° C. or Si which deteriorates above about 500° C. Such high temperature processing of these lithiated ternary metal oxides has also been found to produce crystallite grain sizes generally larger than about one micrometer, thereby severely limiting the electrode surface area, and thus the intercalation kinetics, in typical 0.5 to 1.5 micrometer thin films.

In the present invention, we have found the means to avoid these disadvantages and to fabricate lithiated ternary transition metal oxide thin film intercalation electrodes for secondary batteries under conditions that are compatible with microelectronics technology and that produce high electrode surface area and resulting exceptional performance.

SUMMARY OF THE INVENTION

A thin film intercalation electrode of fine grain lithiated transition metal oxide is prepared in the present invention by low temperature annealing of a stoichiometrically composed thin film lithiated oxide layer deposited by reactive electron beam evaporation onto a suitable substrate from a bulk source of the oxide compound. In order to obtain a desirable 0.05 to 0.1 micrometer crystallite grain size during annealing, any epitaxial influence there may be at the substrate surface which might promote ordered or preferential crystal growth is suppressed by interposing an amorphous, inert buffer layer between the substrate surface and the deposited film.

A crystalline substrate, for example, is typically coated with a thin film layer of gold in any evaporative or sputtering technique to provide such a buffer layer upon which the lithiated electrode compound condenses during the evaporative coating operation. In the subsequent annealing step, the ternary lithiated composition film, having no contact with any influential substrate surface formation, crystallizes to the desired intercalatable phase in unordered, random fashion and thereby develops crystallites no larger than about 0.1 micrometer.

With less influential substrates, such as quartz, stainless steel, aluminum, and the like, the inert buffer layer is nonetheless useful in masking any physical imperfections that might nucleate larger crystal growth. The inert property of the buffer is particularly beneficial in preventing chemical reaction between a substrate and the highly reactive lithium component of the electrode composition film, even at annealing temperatures.

The unique physical and chemical properties of lithium which previously have prevented practical thin film coating of desirable intercalation compositions have been accounted for in the present method of electrode preparation. In order to minimize preferential evaporation of the lower melting lithium and to thus prevent disruption of the stoichiometric component balance of the ternary compound during the coating process, the preannealed intercalation composition source is presented in sufficiently small size to ensure that the non-scanning electron beam cone eminating from the coating apparatus ring filament contacts substantially the entire surface of the source material. Disproportionate accumulation of lithium at the substrate target due to lower atomic mass is limited by reducing the space, and thus the flight time, between the composition source and the target. Finally, reevaporation loss of lithium from the target due to heat generated in the coating process is minimized by supplemental cooling of the substrate until the desired film thickness is deposited.

The lower temperature annealing of the coated ternary composition film that yields fine crystallite formation is made possible by eliminating intermediate exposure of the film to air. A heating element incorporated into the substrate support plate enables the coated film to remain in the evacuated arena throughout the coating and annealing operations. The reactive lithium film component is thereby prevented from otherwise forming the carbonate that requires destructively high annealing temperatures.

After in situ annealing and intercalation compound crystallite formation, the thin film electrode element may be safely removed to ambient atmosphere for completion of conventional storage cell assembly with appropriate electrolyte and anode elements. The thin film lithiated intercalation materials prepared by the present method may be employed also as anodes where it is desired to replaced metallic lithium.

THE DRAWING

The present invention will be described with reference to the accompanying drawing of which:

DESCRIPTION OF THE INVENTION

The thin film materials of the present invention are intended primarily for use as positive electrodes in secondary, i.e., rechargable, lithium battery cells with lithium metal or environmentally preferred lithium intercalated negative electrodes, such as Al, $WO_2$, or graphite. The present intercalatable thin films may, of course, also find use as such substitute negative electrodes. In either event, the invention provides means for preparing these electrodes as thin films which, by generally accepted definition, range up to a few micrometers in thickness.

Previously, maintaining a stoichiometric balance of compound ingredients during the fabrication of such thin film electrodes of known lithium intercalation compounds, e.g., $LiMn_2O_4$, $LiCoO_2$, and $LiNiO_2$, was considered markedly infeasible due to the contributing effects of chemical reactivity of lithium, the great disparity of its melting point and atomic mass from those properties of the component transition metals, and the high temperatures usually required in processing the compounds. For example, the accepted range of annealing temperatures, commonly in excess of 800° C., used in the phase conversion of these lithiated intercalation compounds discouraged their consideration for use in integration of power supplies with microelectronic circuitry typically employing materials decomposing or deteriorating at such temperatures. The vulnerability of other desirable substrates, e.g., aluminum with a melting point of about 700° C., and the exaggerated reactivity of lithium with useful substrate materials also detracted from the appeal of thin film lithiated intercalation compounds.

The present invention, however, avoids these apparent drawbacks in allowing fabrication of thin film electrodes using ternary lithiated transition metal oxides and comparatively low temperature substrate materials. These electrodes not only maintain, but in fact improve upon the functional performance properties of prior bulk or pelletized electrode applications of the same lithiated intercalation compounds in secondary batteries. This advance has been achieved primarily in the ability of the present processing to apply the thin film coating with stoichiometric compound balance and to convert the coated compound to the desired intercalation phase at a lower temperature and in an environment that promote an exceptionally small crystallite, high surface area intercalation medium.

Figure 1:
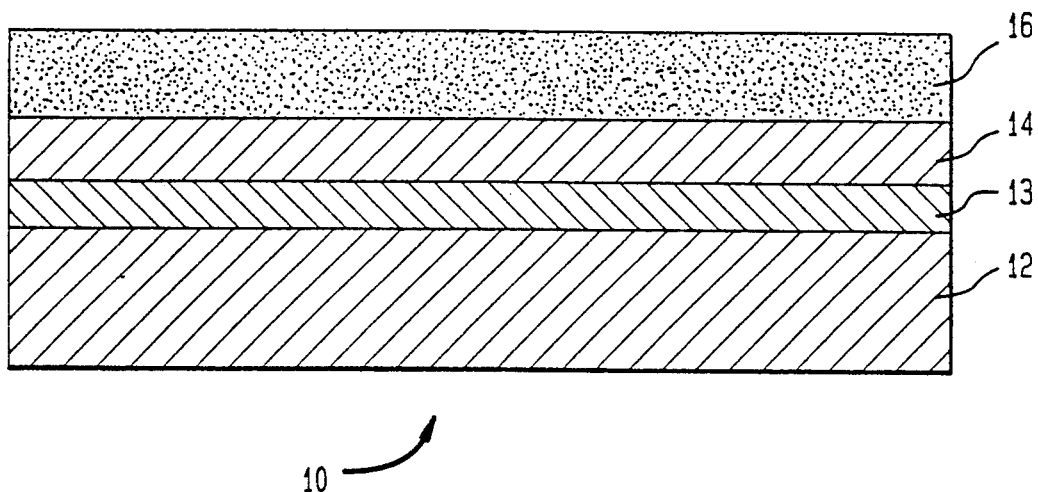
FIG. 1 is a representative elevation view, in cross-section, of a thin film intercalation electrode of the invention.

A typical electrode structure 10, such as used in the present examples, is depicted in FIG. 1 and consists essentially of a substrate 12, an inert buffer layer 14, and a thin film layer 16 of lithiated intercalation compound crystallites. The substrate may be selected from a wide range of materials according to intended application. In the development of the present invention, for instance, nickel and stainless steel substrates served effectively while providing structural testing support. Further, as a means of confirming low temperature applicability of the process, an aluminum substrate later employed in exemplary test cells not only imposed a readily satisfied temperature limitation, but also provided an effective current collector in the test cell assembly. In ultimate use with integrated microelectronic circuitry, substrate 12 could comprise GaAs, Si, or other semiconductor device material. An insulating layer (not shown) of $SiO_2$ or the like would, of course, be interposed between the semiconductor device and the cell structure in order to maintain the autonomous function of each device. Metallic buffer layer 14 could then serve as the electrical contact for the cell electrode.

Gold serves particularly well as the thin film buffer layer 14 at about 300 nm thickness, providing both the desired properties of chemical inertness for protection of the substrate and surface amorphism to minimize ordered crystallite growth. Where gold does not exhibit optimal adhesion to a substrate, a thin film titanium ground layer 13 at about 10 nm is useful to ensure effective bonding. Both these layers may be applied with conventional thermal or electron beam evaporation or sputtering techniques in preparation for deposition of the lithiated thin film intercalation layer 16 in the present process.

Coating of prepared substrates to provide test cell electrodes was carried out in a commercial electron beam evaporator (Edwards High Vacuum International, model E06A) that had been refitted with fixtures for implementing the process of the invention. The approximately 10 mm diameter multiple, carousel-mounted source compound crucibles of the apparatus each accommodated less than about 1 gram of source material and were employed in sequence when deposits of greater than about 1 micrometer thickness was desired. The vertical location of the crucibles was also controllable to enable selective positioning of the source material in the tungsten ring filament electron beam cone. In order to obtain an optimally representative composition of source compound vapors, the active crucible was normally situated during the coating operation on a level at which the beam diameter was substantially the same as that of the source crucible, thus ensuring vaporization over the entire source surface.

The mounting stage for the sample substrate included both a Neslab Coolflow II closed circuit cooling unit and a heater assembly fashioned of a Union Carbide Boralectric boron nitride/graphite resistive heater sandwiched between Hayns-alloy stainless steel plates. The chilled water cooling system was capable of maintaining the substrate surface at about 140° C. during the evaporative coating procedure and the Variac powerstat controlled sample heating system enabled the in situ annealing of lithium metal oxide coating up to temperatures in excess of 900° C. Having this wide range of temperature control during the entire electrode fabrication process was instrumental in eliminating the need for removing the coated substrate from the low pressure, oxygen background environment during transition between these operations. Thus isolating the thin film from atmospheric contact while in its amorphous coated phase avoids the carbonate contamination that previously dictated destructively high temperature phase conversion annealing and led to excessive crystal growth size of the intercalation composition.

Coating source compositions were initially prepared in the manner usually employed for obtaining the bulk, pelletized lithiated intercalation electrode materials. For example, well-mixed stoichiometric proportions of lithium carbonate and manganese oxide are normally reacted in air at 800° C. for at least 24 hour to obtain intercalatable $LiMn_2O_4$. $LiCoO_2$ and $LiNiO_2$ source materials are similarly prepared in known, and even more stringent, process conditions. Scanning electron microscope measurement of these bulk materials indicate a crystal grain size range, e.g., about 1 to 3 micrometers for $LiMn_2O_4$, that is adequate for pellet cathode "button" batteries, but is grossly excessive for use in thin film electrode fabrication. Since these compounds are physically reconstituted from the vapor phase during the present coating process, however, the bulk-prepared source compound loaded into a coating apparatus crucible provides an effective source.

In the fabrication of an exemplary $LiMn_2O_4$ thin film test cell electrode, a 0.5 mm thick prepared aluminum substrate of about 10 mm diameter was affixed to the coating apparatus support stage above the ring filament. The source compound crucibles were arranged on the carousel with one directly below the mounted substrate at a distance of about 225 mm. This separation between the source and substrate was considerably less than commonly employed in the commercial coating apparatus and was selected to minimize the vapor "flight time" to the deposition surface and thereby compensate for the significant difference between the atomic masses of lithium and manganese. Without such compensation, the more rapid movement of the lighter lithium could significantly disrupt the stoichiometric balance of the deposited thin film.

The coating operation generally followed common electron beam evaporation procedures with evacuation of the sealed apparatus at the outset to a base pressure of about 3 to $5 \times 10^{-7}$ torr. A pure oxygen background gas was then added to obtain a stable initial operating pressure of about $3 \times 10^{-5}$ torr which, due to coating material vaporization, would ultimately increase further to about $3 \times 10^{-4}$ torr. The ring filament was then energized at 5.5 KV and about 100 mA to initiate evaporation of the source compound with resulting deposition of the lithiated metal oxide on the substrate. The substrate temperature thereafter increased gradually from the combined affects of the heat radiating from the source and the heat of condensation of the deposited composition. This temperature was allowed to increase to about 140° C. at which it was maintained throughout the remainder of the coating operation by controlling the flow of coolant to the substrate support stage.

Deposition of lithiated compound was monitored by means of the integral quartz crystal microbalance thickness gauge of the coating apparatus and was maintained at a uniform rate of about 0.5 to 1 nm/sec by responsive control of power to the filament. Upon completion of the desired thin film coating of about 1 micrometer, filament power was discontinued. For thin film electrode coatings of up to about 5 micrometers, the nearly depleted source compound crucible was replaced as required during the coating operation with other carousel-mounted crucibles.

At the completion of the coating operation, cooling was discontinued and the oxygen background atmosphere was increased to a range of about 10 to 100 torr. The substrate support stage heating element was then energized to raise the substrate and thin film lithium metal oxide coating to about 400° C. where it was maintained for about 2 hours to effect the desired intercalatable crystalline phase. After natural cooling to ambient temperature, the completed electrode element coating was analyzed by RBS, NMR, and X-ray diffraction techniques and was determined to consist essentially of $Li_xMn_2O_4$ with x nearly 1 and the Li/Mn ratio smaller than the crystal grains of bulk $Li_xMn_2O_4$ intercalation compound annealed at 800° C.

Figure 2:
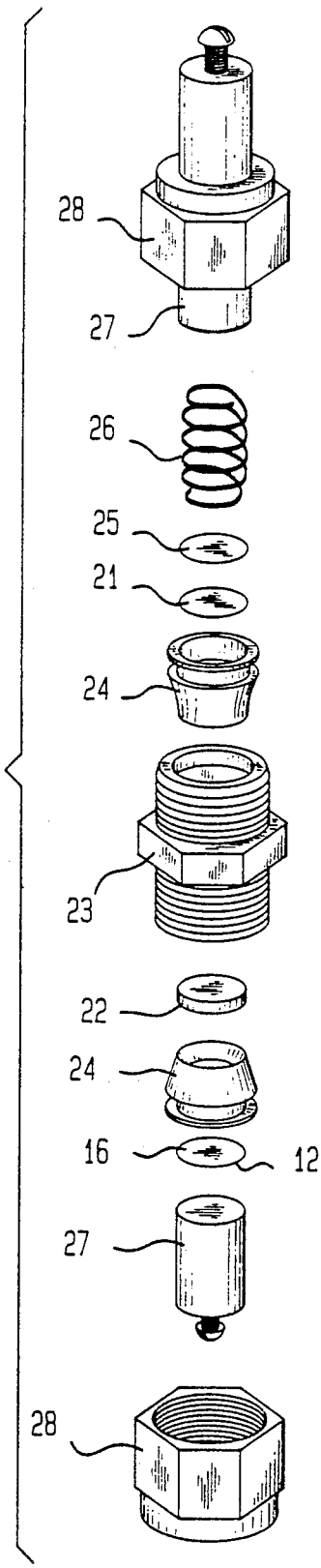
FIG. 2 is an exploded view of a test cell apparatus employed to test the efficacy of a thin film cathode prepared according to the invention.

The intercalation kinetics of the sample electrode thus prepared were tested in a conventional Swagelock test cell generally depicted in FIG. 2. This device comprises a body fitting 23 in which are assembled insulating polypropylene inserts 24 and the active cell elements consisting of the sample cathode of substrate 12 and electrode thin film 16, an anode 21 of lithium-plated stainless steel, and an intermediate electrolyte separator 22 of glass cloth saturated with a 1 molar solution of $LiClO_4$ in equal parts of ethylene carbonate and diethoxyethane. A stainless steel backing plate 25 and compression spring 26 are added and the assembly is completed with stainless steel plungers 27 mounted in and electrically insulated from end caps 28. When caps 28 are threaded upon body 23, the electrolyte and electrode elements are brought into firm active contact to form the test cell.

Figure 3:
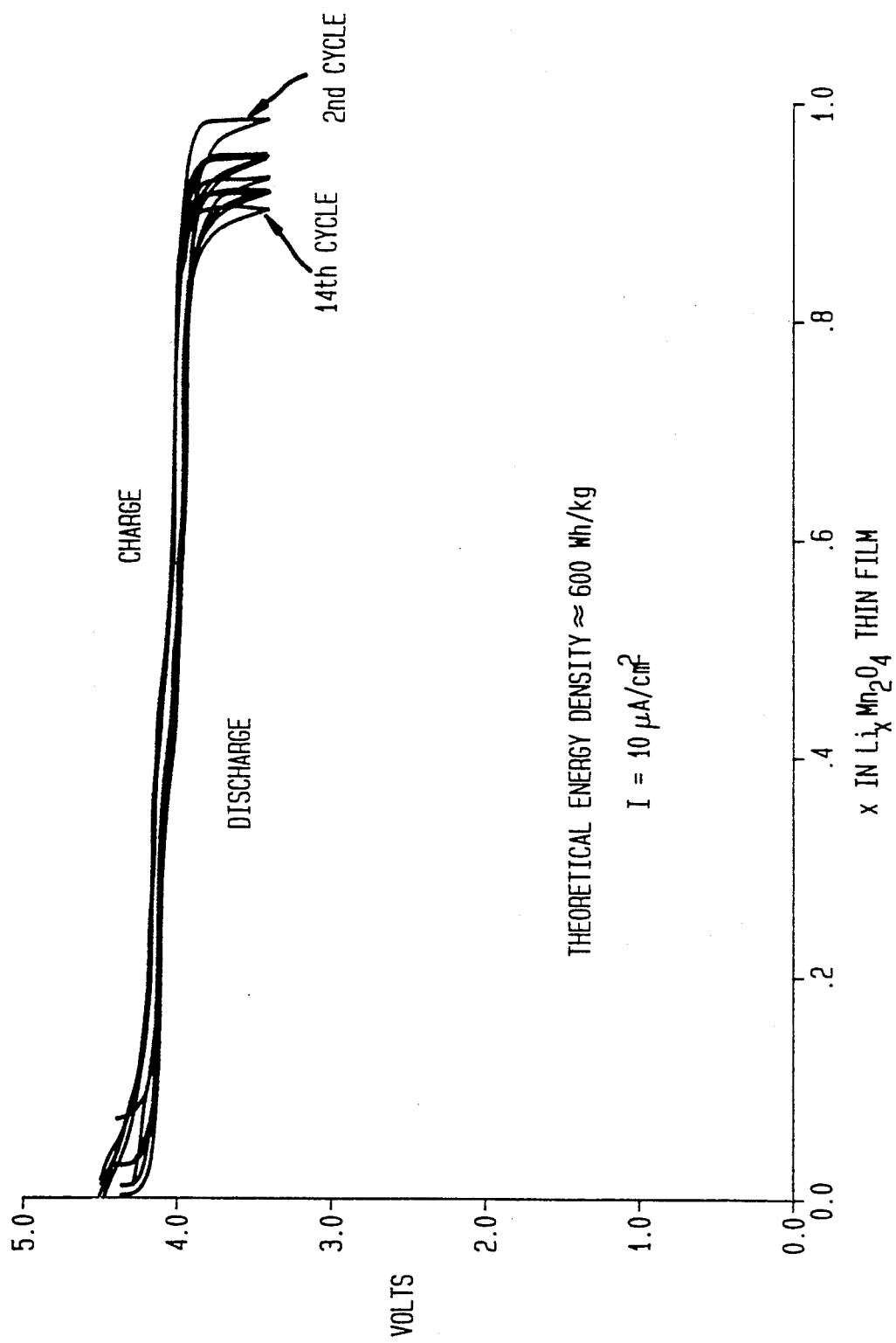
FIG. 3 is a graph of test results of a thin film cathode of the invention charting voltage output and recharging characteristics against the level of lithium in the intercalation composition.

A sample electrode having a 1.5 micrometer thin film layer of about 350 micrograms of $LiMn_2O_4$ was tested over series of charge/discharge cycles at varying current densities. FIG. 3 shows a representative performance of the test cell over the first 14 cycles at a current density of 10 microamps/$cm^2$. The efficacy of the cell is apparent in the exceptionally small voltage difference in the charge and discharge cycling between about 3.5 and 4.4 V which demonstrates the limited polarization of the charges and the ability of the cell to maintain high charge and discharge current densities. Performance at other current densities was likewise superior to prior art thin film electrode cells. For example, even at 55° C. and a current density of 200 microamps/cm$^2$ the sample positive electrode was able to maintain about 70% of the first discharge capacity after more than 200 charge/discharge cycles. Room temperature discharge of the test cell within about 7 minutes at a current density of 500 microamps/cm$^2$ showed polarization of only about 0.1 volt and a capacity decrease of less than about 10% from that exhibited at 100 microamps/cm$^2$.

The admirable performance of the lithiated thin film electrode batteries of the present invention is due in large measure to its capability of maintaining a stoichiometric balance of the coated thin film composition throughout the fabrication process and of enabling a low temperature, unordered formation of fine, high surface area crystallite layers that enhance lithium ion intercalation. These advantageous properties have heretofore not been achieved in other attempted lithiated thin film batteries, nor has the performance of the present test cells been approached with prior thin film batteries of other intercalation compositions. In addition to the suggested variations in electrode composition and processing, it is anticipated that other embodiments of the present invention will undoubtedly occur to the skilled artisan in the light of the foregoing description. Such embodiments are likewise intended to be encompassed within the scope of the invention as recited in the following claims.

What is claimed is:

1. A method of preparing a thin film lithiated transition metal oxide intercalation battery electrode which comprises:
   a) situating a suitable coating substrate in an air-tight enclosure with a supply of said lithiated metal oxide;
   b) establishing within said enclosure a low pressure, carbon-free atmosphere;
   c) vaporizing at least a portion of said metal oxide;
   d) condensing said metal oxide vapor on a surface of said substrate in a coating having a thickness in the range of about 1 to 5 micrometers; and
   e) heating said coating within said atmosphere at a temperature and for a time sufficient to convert said coating to crystallites of said metal oxide having a grain size in the range of about 0.05 to 0.1 micrometers.

2. A method according to claim 1 wherein said lithiated metal oxide is selected from the class consisting of LiMn$_2$O$_4$, LiCoO$_2$, LiNiO$_2$.

3. A method according to claim 1 wherein during said vapor condensing step said carbon-free atmosphere consists essentially of oxygen at a pressure in the range of about 10$^{-5}$ to 10$^{-3}$ torr.

4. A method according to claim 3 wherein said substrate is maintained at a temperature below about 140° C. during said vapor condensing step.

5. A method according to claim 1 wherein said lithiated metal oxide is LiMn$_2$O$_4$ and said heating is effected at about 400° C. in an atmosphere consisting essentially of oxygen at a pressure in the range of about 10 to 100 torr.

6. A method according to claim 5 wherein said heating is effected for a period of about 2 hours.

7. A method according to claim 1 wherein said substrate coating surface consists essentially of an amorphous, substantially chemically inert substance.

8. A method according to claim 7 wherein said substrate coating surface substance is gold.

9. A rechargeable lithium intercalation battery cell comprising a thin film electrode prepared according to the method of claim 2.

10. A battery cell according to claim 9 wherein said thin film is the positive electrode of said cell.

11. A battery cell according to claim 10 wherein said negative electrode comprises a material selected from the class consisting of Li, Al, WO$_2$, and graphite.

12. A rechargeable lithium battery comprising an electrode providing a source of lithium ions, an electrolyte, and a counter-electrode consisting essentially of a lithiated transition metal oxide intercalation compound selected from the class consisting of LiMn$_2$O$_4$, LiCoO$_2$, and LiNiO$_2$ characterized in that said counter-electrode consists essentially of a thin film of said intercalation compound prepared by
  a) situating a suitable coating substrate in an airtight enclosure with a supply of said lithiated metal oxide;
  b) establishing within said enclosure a low pressure, carbon-free atmosphere;
  c) vaporizing at least a portion of said metal oxide;
  d) condensing said metal oxide vapor on a surface of said substrate in a coating having a thickness in the range of about 1 to 5 micrometers; and
  e) heating said coating within said atmosphere at a temperature and for a time sufficient to convert said coating to crystallites of said metal oxide having a grain size in the range of about 0.05 to 0.1 micrometer.

13. A battery according to claim 12
characterized in that said substrate coating surface consists essentially of an amorphous, substantially chemically inert substance.

14. A battery according to claim 13
characterized in that said substrate coating surface substance is gold.

15. A battery according to claim 14
characterized in that said substrate is maintained at a temperature below about 140° C. during said vapor condensing step.

16. A battery according to claim 15
characterized in that said lithiated metal oxide is LiMn$_2$O$_4$ and said heating is effected at about 400° C. in an atmosphere consisting essentially of oxygen at a pressure in the range of about 10 to 100 torr.

17. A battery according to claim 16
characterized in that said heating is effected for a period of about 2 hours.

* * * * *